(12) United States Patent
Collins et al.

(10) Patent No.: US 11,114,284 B2
(45) Date of Patent: Sep. 7, 2021

(54) PLASMA REACTOR WITH ELECTRODE ARRAY IN CEILING

(71) Applicant: Applied Materials, Inc., Santa Clara, CA (US)

(72) Inventors: Kenneth S. Collins, San Jose, CA (US); Michael R. Rice, Pleasanton, CA (US); Kartik Ramaswamy, San Jose, CA (US); James D. Carducci, Sunnyvale, CA (US); Shahid Rauf, Pleasanton, CA (US); Kallol Bera, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 135 days.

(21) Appl. No.: 15/630,658

(22) Filed: Jun. 22, 2017

(65) Prior Publication Data
US 2018/0374685 A1    Dec. 27, 2018

(51) Int. Cl.
*H01J 37/32* (2006.01)
*C23C 16/455* (2006.01)
(Continued)

(52) U.S. Cl.
CPC ...... *H01J 37/32577* (2013.01); *C23C 16/455* (2013.01); *C23C 16/4584* (2013.01); *C23C 16/45519* (2013.01); *C23C 16/45536* (2013.01); *C23C 16/45551* (2013.01); *C23C 16/509* (2013.01); *H01J 37/32091* (2013.01); *H01J 37/32348* (2013.01); *H01J 37/32449* (2013.01); *H01J 37/32541* (2013.01)

(58) Field of Classification Search
CPC .......... H01J 37/32577; H01J 37/32541; H01J 37/32348; H01J 37/32091; H01J 37/32449; C23C 16/455
See application file for complete search history.

(56) References Cited

U.S. PATENT DOCUMENTS

| 4,765,179 A | 8/1988 | Fuller et al. |
| 4,825,467 A | 4/1989 | Rist et al. |
| (Continued) | | |

FOREIGN PATENT DOCUMENTS

JP   06061153 A  *  3/1994

OTHER PUBLICATIONS

Anders, "Plasma and Ion Sources in Large Area Coatings: A Review," The International Conference on Metallurgical Coatings and Thin Films (ICMCTF), Feb. 2005, 42 pages.
(Continued)

*Primary Examiner* — Yuechuan Yu
(74) *Attorney, Agent, or Firm* — Fish & Richardson P.C.

(57) ABSTRACT

A plasma reactor includes a chamber body having an interior space that provides a plasma chamber, a gas distributor to deliver a processing gas to the plasma chamber, a workpiece support to hold a workpiece, an electrode assembly comprising a plurality of conductors spaced apart from and extending laterally across the workpiece support in a parallel coplanar array, a first RF power source to supply a first RF power to the electrode assembly, and a dielectric bottom plate between the electrode assembly and the workpiece support, the dielectric bottom plate providing an RF window between the electrode assembly and the plasma chamber.

18 Claims, 7 Drawing Sheets

(51) Int. Cl.
  *C23C 16/458* (2006.01)
  *C23C 16/509* (2006.01)

(56) References Cited

U.S. PATENT DOCUMENTS

| | | | |
|---|---|---|---|
| 4,903,297 A | 2/1990 | Rist et al. | |
| 5,522,934 A * | 6/1996 | Suzuki | C23C 16/455 |
| | | | 118/723 AN |
| 6,054,013 A | 4/2000 | Collins et al. | |
| 6,164,241 A * | 12/2000 | Chen | H01J 37/321 |
| | | | 118/723 I |
| 6,313,430 B1 | 11/2001 | Fujioka et al. | |
| 6,353,201 B1 | 3/2002 | Yamakoshi et al. | |
| 6,444,085 B1 * | 9/2002 | Collins | B01D 53/22 |
| | | | 156/345.1 |
| 6,456,010 B2 * | 9/2002 | Yamakoshi | H01J 37/32082 |
| | | | 313/231.31 |
| 6,503,816 B2 | 1/2003 | Ito et al. | |
| 7,001,831 B2 | 2/2006 | Niira et al. | |
| 7,205,034 B2 | 4/2007 | Kawamura et al. | |
| 7,833,587 B2 | 11/2010 | Mashima et al. | |
| 7,868,517 B2 | 1/2011 | Belot et al. | |
| 8,081,049 B2 | 12/2011 | Yoshida | |
| 8,129,912 B2 | 3/2012 | Ko et al. | |
| 8,607,733 B2 | 12/2013 | Tachibana | |
| 8,914,166 B2 | 12/2014 | He | |
| 9,165,748 B2 | 10/2015 | Takagi et al. | |
| 9,355,821 B2 | 5/2016 | Chen et al. | |
| 9,396,900 B2 | 6/2016 | Lane et al. | |
| 9,419,583 B2 | 8/2016 | Rinaldi et al. | |
| 9,431,217 B2 | 8/2016 | Mai et al. | |
| 9,554,738 B1 | 1/2017 | Gulati et al. | |
| 2003/0168172 A1 * | 9/2003 | Glukhoy | H01J 37/32082 |
| | | | 156/345.28 |
| 2004/0060662 A1 * | 4/2004 | Yeom | H01J 37/321 |
| | | | 156/345.48 |
| 2005/0067934 A1 | 3/2005 | Ueda et al. | |
| 2007/0012250 A1 * | 1/2007 | Yeom | H01J 37/321 |
| | | | 118/723 AN |
| 2010/0239757 A1 | 9/2010 | Murata | |
| 2012/0247390 A1 * | 10/2012 | Sawada | C23C 16/4412 |
| | | | 118/723 AN |
| 2013/0105086 A1 * | 5/2013 | Banna | H05H 1/46 |
| | | | 156/345.38 |
| 2013/0221833 A1 * | 8/2013 | Kudela | H01Q 13/22 |
| | | | 313/231.31 |
| 2016/0217978 A1 * | 7/2016 | Mai | H01J 37/32091 |

OTHER PUBLICATIONS

Chang et al., "Generating large-area uniform microwave field for plasma excitation," Physics of Plasmas, 2012, 19, 6 pages.
Chen et al., "Generation of uniform large-area very high frequency plasmas by launching two specific standing waves simultaneously," Journal of Applied Physics, 2014, 116, 9 pages.
Chen et al., "Generation of Uniform Large-Area VHF Plasmas by Launching a Traveling Wave," Plasma Processes and Polymers, Jan. 2014, 11(1): 7-11.
Cober Electronics, Inc., "Plasmaline Large Area Plasma Systems," Stan Whitehair, 21 pages.
Goya et al., "Development of Amorphous Silicon/Microcrystalline Silicon Tandem Solar Cells," 3$^{rd}$ World Conference on Photovoltaic Energy Conversion, Osaka, Japan, May 11-18, 2003, 1570-1573.
He and Hall, "Longitudinal voltage distribution in transverse rf discharge waveguide lasers," J. Appl. Phys., Aug. 1983, 54(8): 4367-4373.
Hollenstein et al., "Resonant RF network antennas for large-area and large-volume inductively coupled plasma sources," Plasma Sources Sci. Technol., 2013, 22: 1-10.
Hwang et al., "Dual comb-type electrodes as a plasma source for very high frequency plasma enhanced chemical vapor deposition," Thin Solid Films, 2010, 518: 2124-2127.
Ito et al., "Large Area Deposition of Hydrogenated Amorphous Silicon by VHF-PECVD Using Novel Electrodes," IEEE, 900-903.
Livesay, "Large-area electron-beam source," J. Vac. Sci. Technol., Nov. 1993, 11(6): 2304-2308.
Mashima et al., "Characteristics of Very High Frequency Plasma Produced Using a Ladder-Shaped Electrode," Jpn. J. Appl. Phys., 1999, 38: 4305-4308.
Mashima et al., "Large area VHF plasma production using a ladder-shaped electrode," Thin Solid Films, 2006, 512-516.
Meiling et al., "Film Uniformity and Substrate-to-Electrode Attachment in Large-Area VHF Glow-Discharge Deposition of a-Si:H," 25$^{th}$ PVSC, May 1996, 1153-1156.
Morrison et al., "Deposition of Microcrystalline Silicon Films and Solar Cells via the Pulsed PECVD Technique," IEEE, 1102-1105.
Noda et al., "Large Area Thin Film Si Tandem Module Production Using VHF Plasma with a Ladder-Shaped Electrode," 3$^{rd}$ World Conference on Photovoltaic Energy Conversion, May 11-18, 2003, Osaka, Japan, 1849-1851.
Satake et al., "Experimental and numerical studies on voltage distribution in capacitively coupled very high-frequency plasmas," Plasma Sources Sci. Technol., 2004, 13: 436-445.
Sato et al., "Design of Folded Monopole Array Antenna Used for Large Area Plasma Production," IEEE, 2004, 1026-1029.
Schmidt et al., "Improving plasma uniformity using lens-shaped electrodes in a large area very high frequency reactor," Journal of Applied Physics, May 2004, 95(9): 4559-4564.
Schmidt, "Characterization of a High-Density, Large-Area VHF Plasma Source," Characterization of a High-Density, Large-Area VHF Plasma Source, 2006, 154 pages.
Stephan and Kuske, "Large Area Deposition Technique for PECVD of Amorphous Silicon," IEEE, 1997, 647-650.
Takagi et al., "Large Area Multi-Zone Type VHF-PCVD System for a-Si and μc-Si Deposition," 3$^{rd}$ World Conference on Photovoltaic Energy Conversion, May 11-18, 2003, Osaka, Japan, 1792-1795.
Terasa et al., "PECVD of Doped and Intrinsic A-SI:H Layers for Solar Cell Structures Using a (Novel) Inline Deposition System," IEEE, 1528-1531.
Wu et al., "A traveling wave-driven, inductively coupled large area plasma source," Applied Physics Letters, Feb. 1998, 72(7): 777-779.
Wu et al., "The influence of antenna configuration and standing wave effects on density profile in a large-area inductive plasma source," Plasma Sources Sci. Technol., 2000, 9: 210-218.
Yamauchi et al., "Development of a-Si/Micro-crystalline-Si Tandem-type Photovoltaic Solar Cell," Technical Review, Oct. 2005, 42(3): 1-5.
Yamauchi et al., "High Efficiency Large Area Solar Module in Mitsubishi Heavy Industries," Technical Review, Oct. 2004, 41(5): 1-4.
Yu et al., "Linear Plasma Sources for Large Area Film Deposition: A Brief Review," Plasma Science and Technology, Apr. 2014, 16(4): 356-362.
Muegge, Microwave Plasma Processing, 2013, 12 pages.

* cited by examiner

PLASMA REACTOR WITH ELECTRODE ARRAY IN CEILING

TECHNICAL FIELD

The present disclosure relates to a plasma reactor, e.g. for depositing a film on, etching, or treating a workpiece such as a semiconductor wafer.

BACKGROUND

Plasma is typically generated using a capacitively-coupled plasma (CCP) source or an inductively-coupled plasma (ICP) source. A basic CCP source contains two metal electrodes separated by a small distance in a gaseous environment similar to a parallel plate capacitor. One of the two metal electrodes are driven by a radio frequency (RF) power supply at a fixed frequency while the other electrode is connected to an RF ground, generating an RF electric field between the two electrodes. The generated electric field ionizes the gas atoms, releasing electrons. The electrons in the gas are accelerated by the RF electric field and ionizes the gas directly or indirectly by collisions, producing plasma.

A basic ICP source typically contains a conductor in a spiral or a coil shape. When an RF electric current is flowed through the conductor, RF magnetic field is formed around the conductor. The RF magnetic field accompanies an RF electric field, which ionizes the gas atoms and produces plasma.

Plasmas of various process gasses are widely used in fabrication of integrated circuits. Plasmas can be used, for example, in thin film deposition, etching, and surface treatment.

Atomic layer deposition (ALD) is a thin film deposition technique based on the sequential use of a gas phase chemical process. Some ALD processes use plasmas to provide necessary activation energy for chemical reactions. Plasma-enhanced ALD processes can be performed at a lower temperature than non-plasma-enhanced (e.g., 'thermal') ALD processes.

SUMMARY

In one aspect, a plasma reactor includes a chamber body having an interior space that provides a plasma chamber, a gas distributor to deliver a processing gas to the plasma chamber, a workpiece support to hold a workpiece, an electrode assembly comprising a plurality of conductors spaced apart from and extending laterally across the workpiece support in a parallel coplanar array, a first RF power source to supply a first RF power to the electrode assembly, and a dielectric bottom plate between the electrode assembly and the workpiece support, the dielectric bottom plate providing an RF window between the electrode assembly and the plasma chamber.

Implementations may include one or more of the following features.

The plurality of conductors may be positioned between a dielectric top plate and the dielectric window. The dielectric top plate may be a ceramic body and the dielectric bottom plate may be quartz or silicon nitride.

A lower surface of the bottom plate may have a plurality of parallel grooves, and the plurality of parallel coplanar conductors may be positioned in the plurality of parallel grooves. A plurality of filaments may be positioned in the plurality of grooves. Each filament may include a conductor and a non-metallic shell surrounding the conductor. The shell may form a conduit and the conductor may be suspended in and extends through the conduit. The conductor may include a hollow conduit.

The plurality of conductors may be coated on the dielectric top plate. The plurality of conductors may be embedded in the dielectric top plate.

The plurality of conductors may be uniformly spaced apart. A spacing between the workpiece support and the plurality of conductors may be 2 mm to 50 cm.

The plurality of conductors may include a first multiplicity of conductors and a second multiplicity of conductors arranged in an alternating pattern with the first multiplicity of conductors. The RF power source may be configured to apply a first RF input signal to the first multiplicity of conductors, and to apply a second RF input signal to the second multiplicity of conductors. The RF power source may be configured to generate the first RF signal and the second RF signal with same frequency. The RF power source may be configured to generate the first RF signal and the second RF signal such that a phase difference between the first RF signal and the second RF signal is 180°. The RF power source may be configured to provide an adjustable phase difference between the first RF signal and the second RF signal.

The plurality of conductors may have a plurality of first ends at a first side of the plasma chamber and a plurality of second ends at an opposite second side of the plasma chamber. The RF power source may be configured to apply the first RF input signal to the first ends of the first multiplicity of conductors and to apply the second RF input signal to the second ends of the second multiplicity of conductors. The second ends of the first multiplicity of conductors may be floating and first ends of the second multiplicity of conductors may be floating. The first ends of the first multiplicity of conductors may be connected to a first common bus, and the second ends of the second multiplicity of conductors may be connected to a second common bus. The first multiplicity of filaments may be grounded and the first ends of the second multiplicity of filaments may be grounded.

The first ends of the first multiplicity of conductors may be connected to a first common bus located outside the plasma chamber on the first side of the chamber, and the second ends of the second multiplicity of conductors may be connected to a second common bus located outside the plasma chamber on the second side of the chamber. The second ends of the first multiplicity of conductors may be connected to a third common bus located outside the plasma chamber on the second side of the chamber, and the first ends of the second multiplicity of conductors may be connected to a fourth common bus located outside the plasma chamber on the first side of the chamber.

Certain implementations may have one or more of the following advantages. Plasma uniformity may be improved. Plasma process repeatability may be improved. Metal contamination may be reduced. Particle generation may be reduced. Plasma charging damage may be reduced. Uniformity of plasma may be maintained over different process operating conditions. Plasma power coupling efficiency may be improved.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

Like reference symbols in the various drawings indicate like elements.

DETAILED DESCRIPTION

In some plasma chambers, a workpiece is moved through a plasma processing region on, for example, a linear or rotating workpiece support. In such a chamber, the moving workpiece support may be DC grounded through, for example, a rotary mercury coupler, brushes, or slip rings. However, the moving workpiece support may not be adequately grounded at radio frequencies. The RF ground path should have substantially lower impedance than the plasma for it to be an adequate RF ground. The lack of an adequate RF ground path may make it difficult to control ion energy at the workpiece and reduce the repeatability of the process.

A plasma source with the following properties is thus desired: it can efficiently produce a uniform plasma with the desired properties (plasma density, electron temperature, ion energy, dissociation, etc.) over the workpiece size; it is tunable for uniformity over the operating window (e.g. pressure, power, gas composition); it has stable and repeatable electrical performance even with a moving workpiece; and it does not generate excessive metal contaminants or particles.

Figure 1:
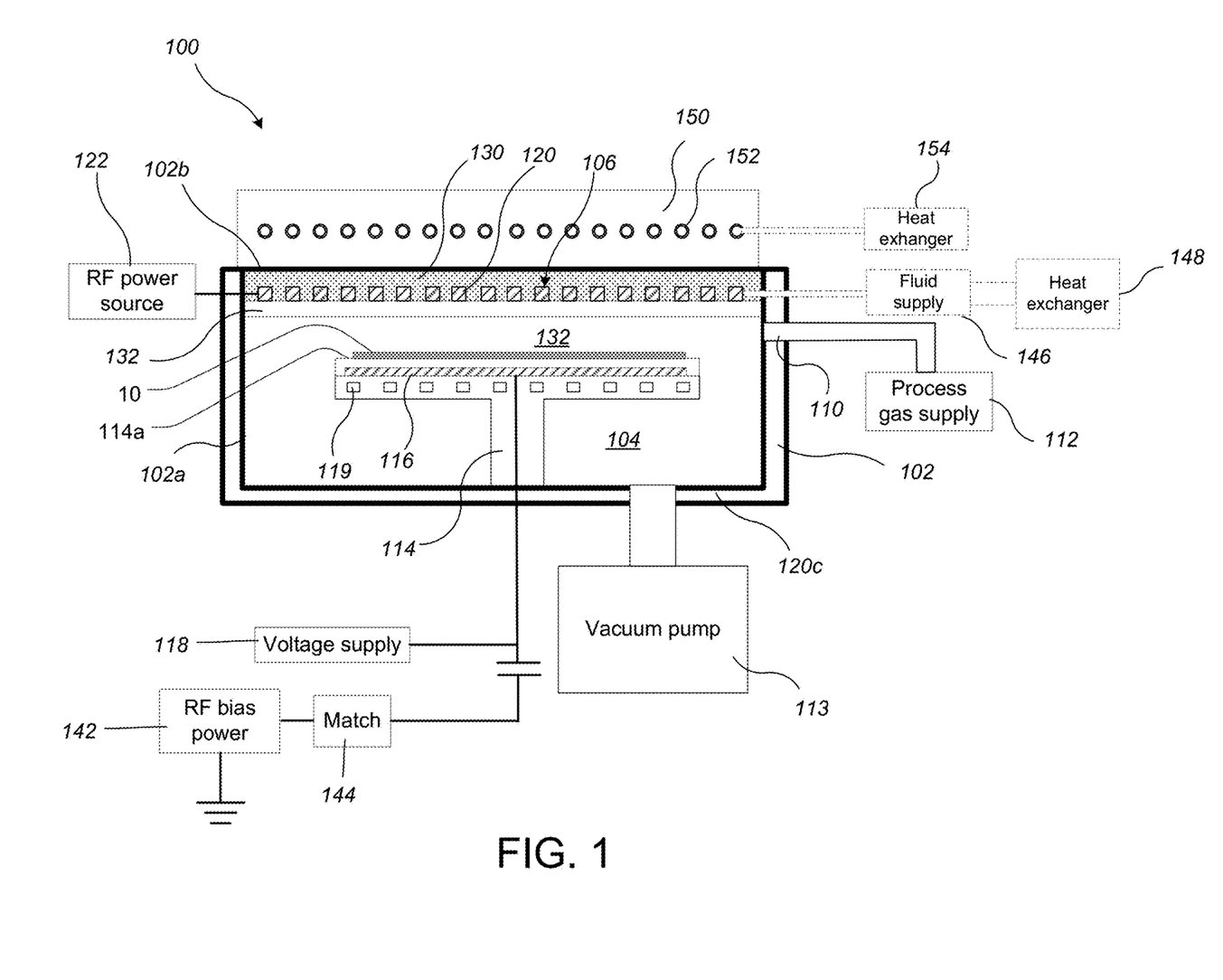
FIG. 1 is a schematic side view of an example of a plasma reactor.

FIG. 1 is a schematic side view diagram of an example of a plasma reactor. A plasma reactor 100 has a chamber body 102 enclosing an interior space for use as a plasma chamber. The chamber body 102 can have one or more side walls 102a, a ceiling 102b and a floor 102c. The interior space 104 can be cylindrical, e.g., for processing of circular semiconductor wafers. The plasma reactor includes a top electrode array assembly 106 located at the ceiling of the plasma reactor 100. The top electrode array assembly 106 can abut the ceiling (as shown in FIG. 1), or be suspended within the interior space 104 and spaced from the ceiling, or form a portion of the ceiling. Some portions of the side walls of and floor of the chamber body 102 can be separately grounded.

A gas distributor is located near the ceiling of the plasma reactor 100. The gas distributor can include one or more ports 110 in the side walls 102 that are connected to a process gas supply 112. Alternatively or in addition, the gas distributor can be integrated with the top electrode assembly 106 as a single component. For example, passages connected to the process gas supply 112 can be formed through a dielectric plate in the assembly 112 to provide openings in the ceiling of the plasma chamber. The gas supply 112 delivers one or more process gases to the gas distributor 110, the composition of which can depend on the process to be performed, e.g., deposition or etching.

A vacuum pump 113 is coupled to the interior space 104 to evacuate the plasma reactor. For some processes, the chamber is operated in the Torr range, and the gas distributor supplies argon, nitrogen, oxygen and/or other gases.

Depending on chamber configuration and supplied processing gasses, the plasma reactor 100 could provide an ALD apparatus, an etching apparatus, a plasma treatment apparatus, a plasma-enhanced chemical vapor deposition apparatus, a plasma doping apparatus, or a plasma surface cleaning apparatus.

The plasma reactor 100 includes a workpiece support 114, such as a pedestal, for supporting a workpiece with a top surface exposed to plasma formed in the chamber 104. The workpiece support 114 has a workpiece support surface 114a facing the top electrode 108. In some implementations, the workpiece support 114 includes a workpiece support electrode 116 inside the support 114, and a workpiece bias voltage supply 118 is connected to the workpiece support electrode 116. The voltage supply 118 can apply a voltage to chuck the workpiece 115 to the support 114 and/or supply a bias voltage to control characteristics of the generated plasma, including the ion energy. In some implementations, an RF bias power generator 142 is AC-coupled through an impedance match 144 to the workpiece support electrode 116 of the workpiece support 114.

Additionally, the support 114 can have internal passages 119 for heating or cooling the workpiece 115, and/or an embedded resistive heater (119).

The electrode assembly 106 is positioned at the ceiling of the chamber 104. This electrode assembly 106 includes a plurality of conductors 120 that extend laterally over the workpiece support 114. At least in the region over the expected position of the workpiece on the support 114, the conductors 120 be coplanar. For example, in this region the conductors can extend parallel to the support surface 114a. The plurality of conductors 120 may be arranged as an array of parallel lines. In some implementations, conductors could have a "U-shape" with both ends connected to respective buses on the same side of the chamber 104. Alternatively, the conductors could be arranged as interleaved spirals (either interleaved circular spirals or interleaved rectangular spirals). The longitudinal axis of the conductors 120 can be arranged at a non-zero angle, e.g., an angle greater than 20 degrees, to the direction of motion of the workpiece 10 below the electrode assembly 106. For example, the longitudinal axis of the conductors 120 can be substantially perpendicular to the direction of motion of the workpiece 10.

A gap 132 is formed between the workpiece support 114 and the electrode assembly 106. For high pressure, e.g., 1-10 torr, the gap 132 may be 2-25 mm. A stationary workpiece may requiring greater minimum gap, e.g., about 5 mm, depending on electrode-to-electrode spacing on source, and thickness of dielectric cover. At lower pressure, e.g., less than 100 mTorr, the gap 132 may be 1 cm to 50 cm.

In some implementations, a fluid supply 146 circulates a fluid through the electrode assembly 106. In some implementations, a heat exchanger 148 is coupled to the fluid supply 146 to remove or supply heat to the fluid.

The electrode assembly 106 is driven by an RF power source 122. The RF power source 122 can apply power to the conductors 120 of the electrode assembly 106 at frequencies of, e.g., 1 to 300 MHz. For some processes, the RF power source 122 provides a total RF power of more than 2 kW at a frequency of 60 MHz.

In some implementations, a heat sink 150, e.g., an aluminum plate, is attached to the ceiling 102b of the chamber body 102. Passages 152 can be formed through the heat sink 150, and coolant can circulate through the passages 152. A heat exchanger 154 can be coupled to the passages 152 to remove or supply heat to the coolant.

Figure 2A:
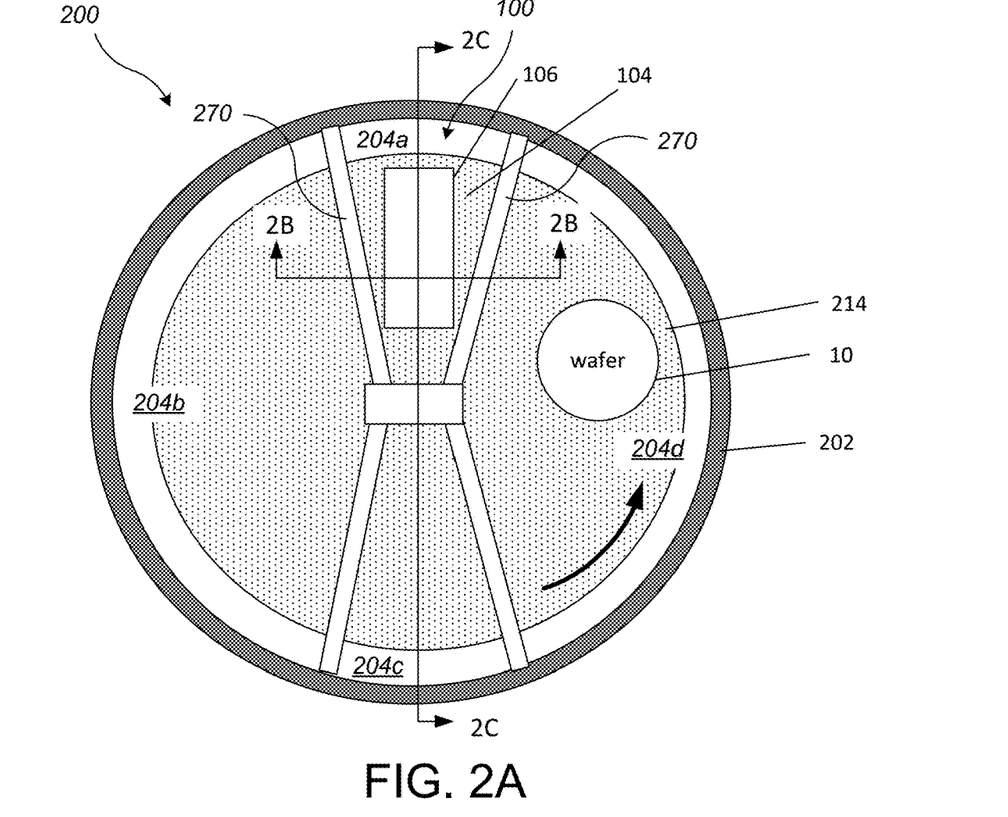
FIG. 2A is a schematic top view of another example of a plasma reactor.
Figure 2B:
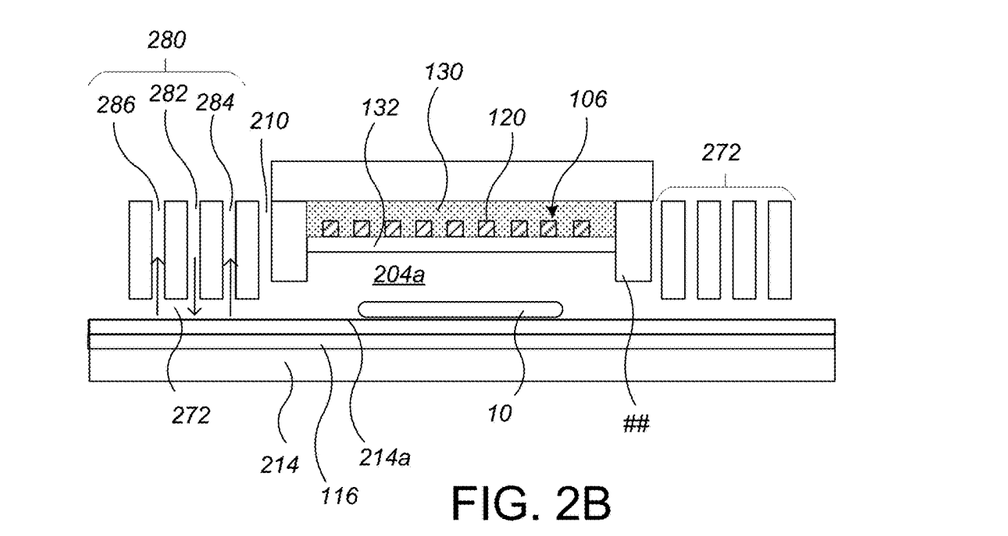
FIGS. 2B and 2C are schematic side views of the plasma reactor of FIG. 2A along lines 2B-2B and 2C-2C, respectively.
Figure 2C:
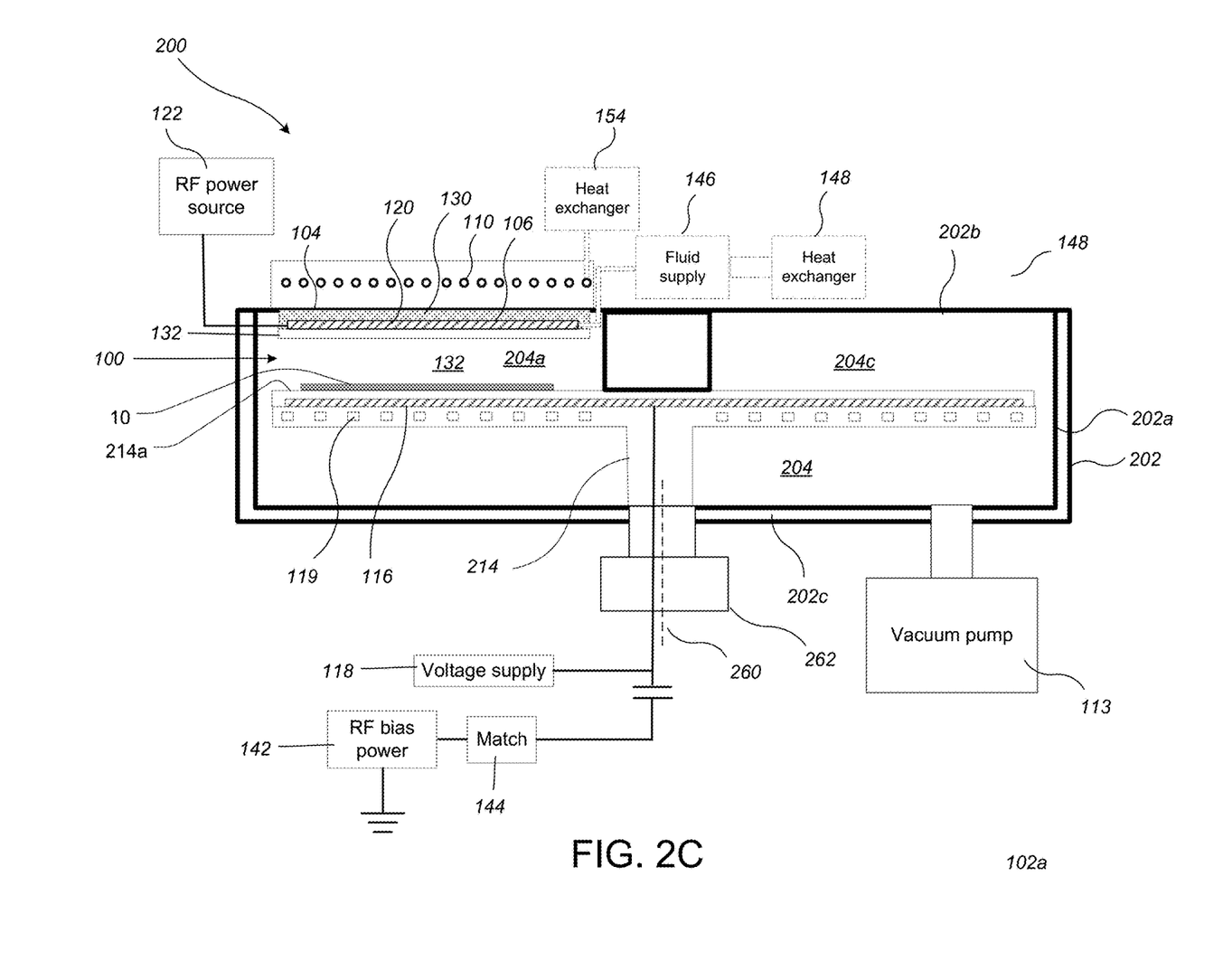

FIGS. 2A-2C are schematic views of another example of a plasma reactor. In this example, which operates the same as FIG. 1 except as described, a multi-chamber processing tool 200 includes a plasma reactor 100.

The processing tool 200 has a body 202 enclosing an interior space 204. The body 102 can have one or more side walls 202a, a ceiling 202b and a floor 202c. The interior space 204 can be cylindrical.

The processing tool 200 includes a workpiece support 214, such as a pedestal, for supporting one or more workpieces 10, e.g., a plurality of workpieces. The workpiece support 214 has a workpiece support surface 214a. The workpiece support 214 can includes the workpiece support electrode 116, and a workpiece bias voltage supply 118 can be connected to the workpiece support electrode 116.

A space between the top of the workpiece support 214 and the ceiling 202b can be divided into a plurality of chambers 204a-204d by barriers 270. The barriers 270 can extend radially from a center of the workpiece support 214. Although four chambers are illustrated, there could be two, three or more than four chambers.

The workpiece can be rotatable about an axis 260 by a motor 262. As a result, any workpiece 10 on the workpiece support 214 will be carried sequentially through the chambers 204a-204d.

The chambers 204a-204d can be at least partially isolated from each other by a pump-purge system 280. The pump-purge system 280 can include multiple passages formed through the barrier 210 that flow a purge gas, e.g., an inert gas such as argon, into a space between adjacent chambers, and/or pump gas out of a space between adjacent chambers. For example, the pump-purge system 280 can include a first passage 282 though which a purge gas is forced, e.g., by a pump, into the space 202 between the barrier 272 and the workpiece support 214. The first passage 282 can be flanked on either side (relative to direction of motion of the workpiece support 214) by a second passage 284 and a third passage 286 which are connected to a pump to draw gas, include both the purge gas and any gas from the adjacent chamber, e.g., chamber 204a. Each passage can be an elongated slot that extends generally along the radial direction.

At least one of the chambers 204a-204 provides a plasma chamber of a plasma reactor 100. The plasma reactor includes the top electrode array assembly 106 and RF power source 122, and can also include the fluid supply 146 and/or heat exchanger. Process gas can be supplied through a port 210 located along one or both barriers 270 to the chamber 104. In some implementations, the port 210 is positioned only on the leading side of the chamber 104 (relative to direction of motion of the workpiece support 214). Alternatively or in addition, process gas can be supplied through ports the side wall 202a of the tool body 202.

Figure 3A:
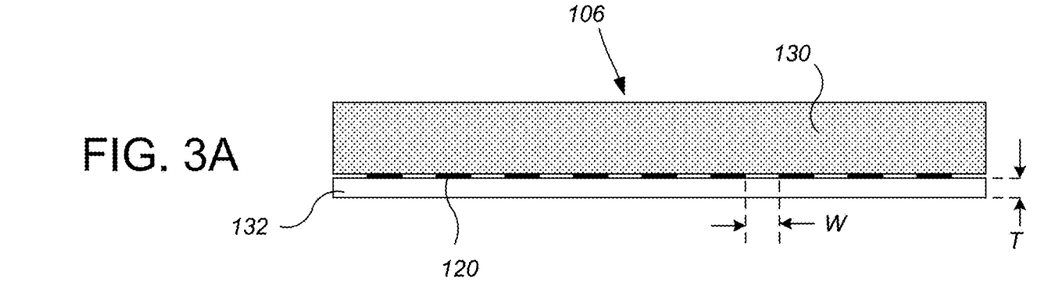
FIGS. 3A-3C are schematic cross-sectional views of an electrode assembly.

FIG. 3A illustrates an example of an electrode assembly 106. The electrode assembly 106 includes a dielectric top plate 130, a plurality of conductors 120, and a dielectric bottom plate 132. As noted above, the conductors 120 can be arranged as parallel linear stripes that extend laterally over the workpiece support 114. The dielectric top plate 130 can be a ceramic material.

The dielectric bottom plate 132 provides a window for RF power, i.e., is substantially transparent to RF radiation of the frequency used to generate the plasma. For example, the bottom plate 132 can be quartz or silicon nitride. The bottom plate can protect the plasma process and workpiece environment from metal contamination or particle formation that may otherwise occur if the conductors or ceramic were exposed to plasma. The bottom plate 132 can be a consumable part that is replaced periodically. The bottom plate can be relatively thin, e.g., 0.25 mm-2 mm, such as 0.5 mm.

The conductors can have a width of 1-5 mm, and a separation W between the conductors 120 can be 0.5 to 3 mm. The conductors can be wider than the separation, e.g., about twice as wide.

The thickness T of the lower dielectric plate 132 should be less than twice the separation W between conductors 120, e.g., less than the separation W between conductors. A gap between the lower dielectric plate 132 and the upper dielectric plate 130 should be "small", e.g., less than 0.5 mm, e.g., less than 0.25 mm, at higher pressure to avoid plasma occurring behind plate.

The conductors 120 can be formed directly on a lower surface of the dielectric top plate surface 130. For example, the conductors 120 can be formed by deposition (e.g. plating, sputtering or CVD) of a thin layer across the bottom surface followed by patterning by etching, to form a stripline structure. The conductors can then be covered by the dielectric bottom dielectric plate 132.

The conductors 120 can also be embedded in, i.e., be buried below the surface of, the dielectric top plate. For example, the top plate 130 can be a ceramic structure, similar in construction to an electrostatic wafer chuck. For the buried conductor, the dielectric bottom plate becomes optional, but can still be used as a dielectric cover, e.g., of quartz, to protect the bottom surface of the top plate.

In an exemplary implementation, 45 pairs (90 total) of parallel conductors 120 are deposited on a square structural ceramic top plate 130. The linewidth of the conductors 120 is 3 mm each, with 1.5 mm separation (so the conductors are arranged at a pitch of 4.5 mm). The conductors can be 400 mm long, with vertical feedthroughs through the ceramic top plate 130, and electrical connections made on backside at atmospheric pressure. Every other electrode is connected to a bus on one side, and the remaining (alternating) electrodes are each connected to a bus on the other side, thus forming two arrays. RF power at 60 MHz and 180 degree phase difference is connected across the 2 arrays.

Figure 3B:
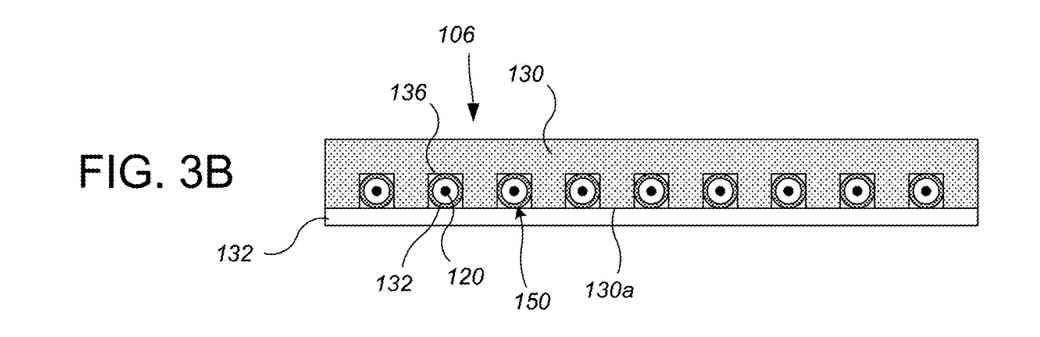

Referring to FIG. 3B, a plurality of grooves 136 can be formed in a bottom surface 130a of the dielectric top plate 130, and the conductors 120 can fit into the grooves. The grooves 136 can be arranged as parallel linear stripes.

Figure 4A:
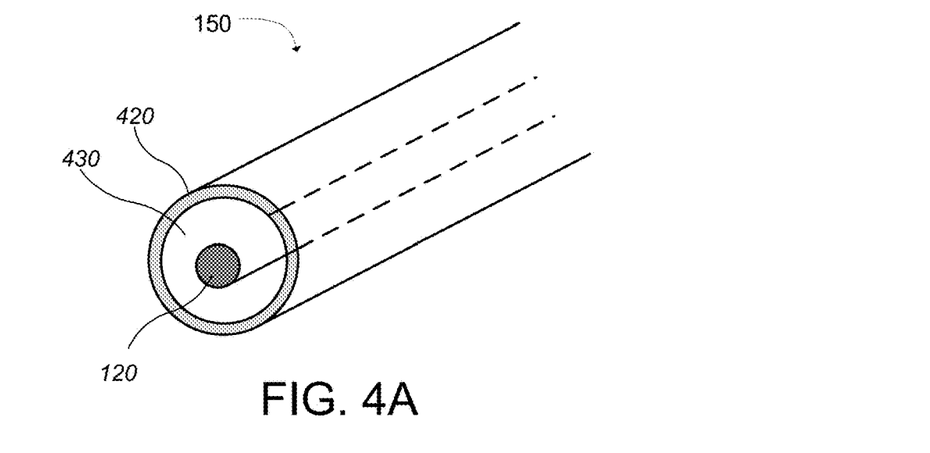
FIGS. 4A-4C are schematic cross-sectional and perspective view diagrams of various examples of a filament of an intra-chamber electrode assembly.
Figure 4B:
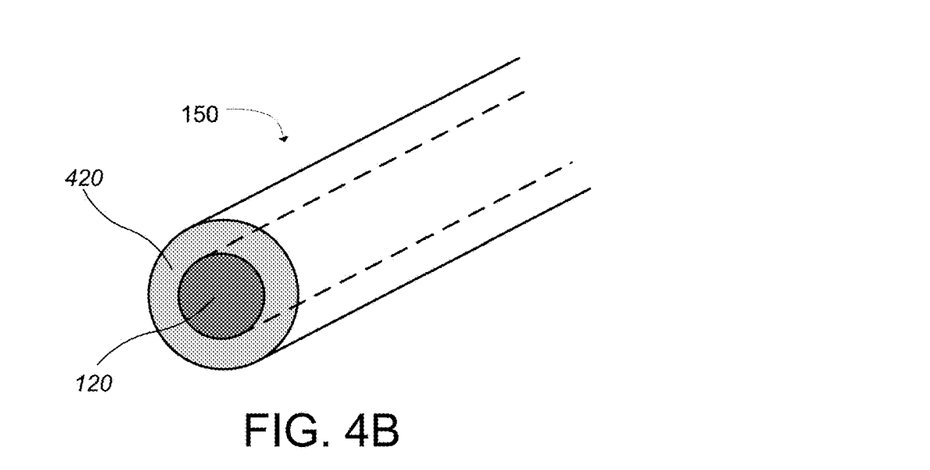
Figure 4C:
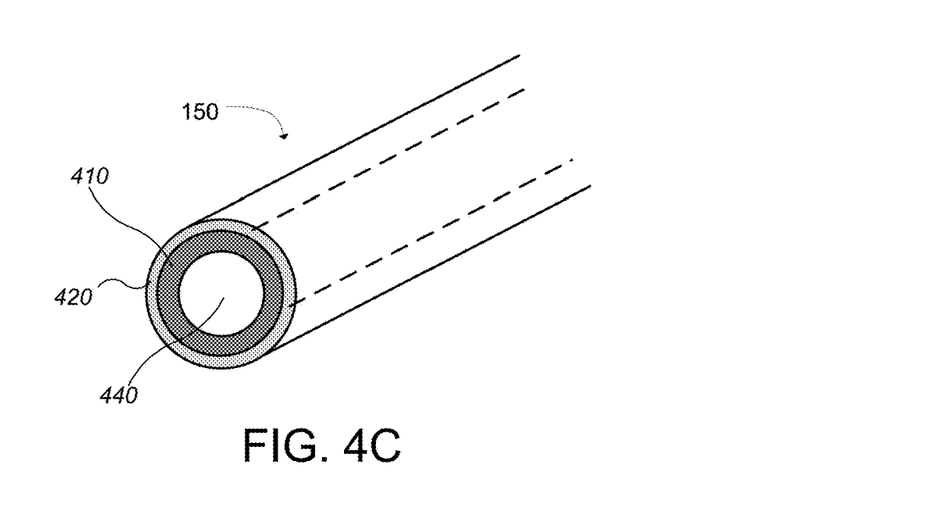

In some implementations, each conductor 120 is part of a filament 150. The filament 150 can fit into its respective groove 136. The filament 150 can include a shell that surrounds and protects the conductor 120. FIGS. 4A-C are schematic diagrams of various examples of a filament for the electrode assembly.

Referring to FIG. 4A, in some implementations the filament 150 includes the conductor 120 and a cylindrical shell 420, e.g., a tube or conduit, that surrounds and extends along the conductor 120. A conduit 430 is formed by a gap between the conductor 120 and the shell 420. The shell 420 is formed of a non-metallic material that is compatible with the process. In some implementations, the shell is semiconductive. In some implementations, the sheath is insulative.

In some implementations, e.g., in case of leakage permits the process gas to access the region above the bottom plate 132, the shell 420 is formed of a process-compatible material such as silicon, e.g., a high resistivity silicon, an oxide material, a nitride material, a carbide material, a ceramic material, or a combination thereof. Examples of oxide materials include silicon dioxide (e.g., silica, quartz) and aluminum oxide (e.g., sapphire). Examples of carbide materials include silicon carbide. In some implementations, the shell 420 has a thickness 1 mm.

In some implementations, a fluid is provided in the conduit 430. In some implementations, the fluid is a non-oxidizing gas to purge oxygen to mitigate oxidization of the conductor 120. Examples of non-oxidizing gases are nitrogen and argon. In some implementations, the non-oxidizing gas is continuously flowed through the conduit 430, e.g., by the fluid supply 146 (see FIGS. 1 and 2A), to remove residual oxygen.

The heating of conductor 120 can make the conductor more susceptible to oxidization. The fluid can provide cooling to the conductor 120, which may heat up from supplied RF power. In some implementations, the fluid is circulated through the conduit 120, e.g., by the fluid supply 146, to provide forced convection temperature control, e.g., cooling or heating.

In some implementations, the fluid may be at or above atmospheric pressure to prevent breakdown of the fluid.

Referring to FIG. 4B, in some implementations of the filament 150, the conductor 120 has a coating 420 that provides the shell. In some implementations, the coating 420 is an oxide of the material forming the conductor (e.g., aluminum oxide on an aluminum conductor). In some implementations, the coating 420 is silicon dioxide.

Referring to FIG. 4C, in some implementations of the filament 150, the conductor 120 is hollow, and a conduit 440 is formed inside the conductor 410. In some implementations, the conduit 440 can carry a fluid as described in FIG. 4A. A coating of the process-compatible material can cover the conductor 410 to provide the cylindrical shell 420. In some implementations, the coating 320 is an oxide of the material forming the conductor (e.g., aluminum oxide on an aluminum conductor).

Figure 3C:
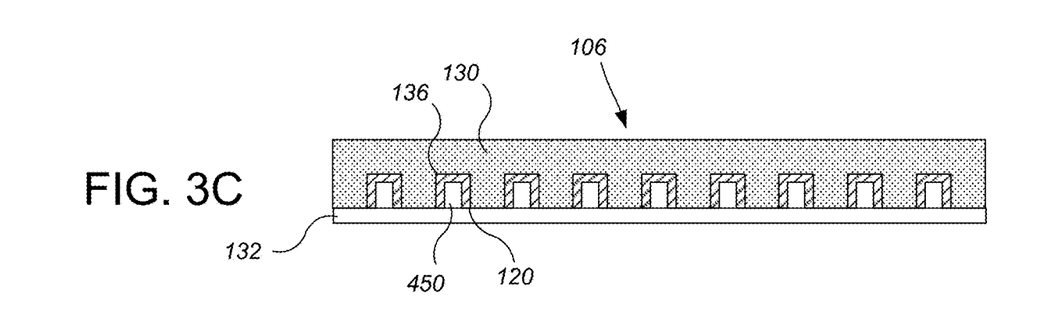

Referring to FIG. 3C, in some implementations, the conductors 120 can be provided by a conductive coating on the top plate 130. For example, the conductor 120 can be a stripline electrode plated on the ceramic top plate 130. Each conductor 120 can be a coating on one or more interior surfaces of a respective groove 136. A space between the conductor 120 and the bottom plate 132 can provide a conduit 450. The conduit 450 can carry a fluid as described in FIG. 4A.

Figure 5A:
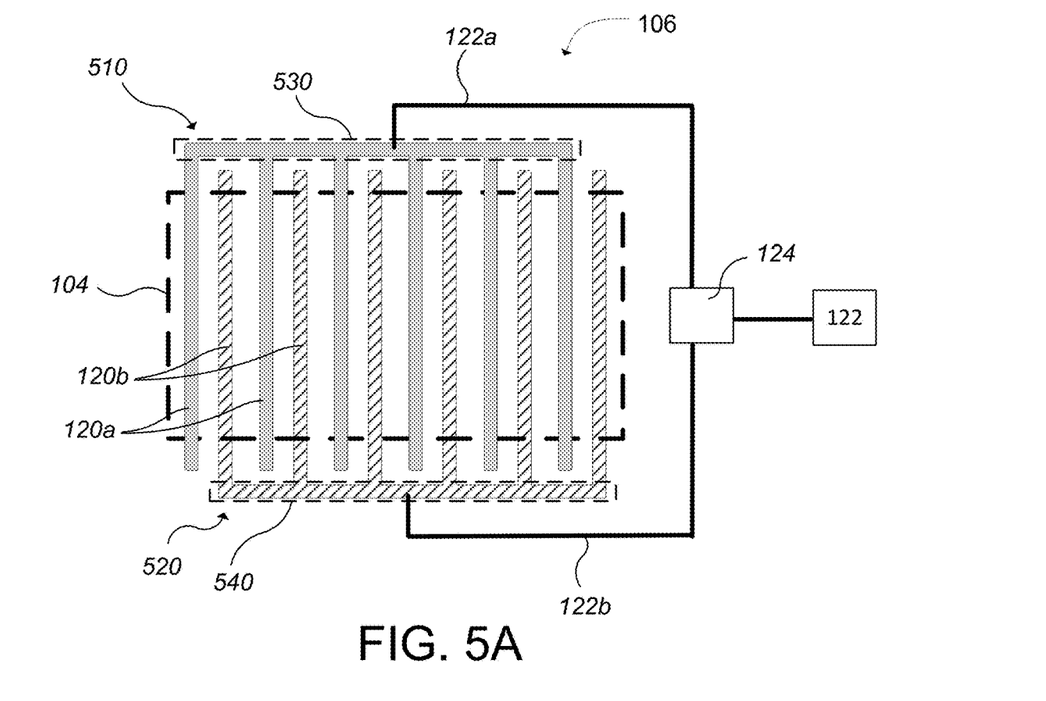
FIGS. 5A-5C are schematic top view diagrams of various examples of electrode assembly configurations.
Figure 5B:
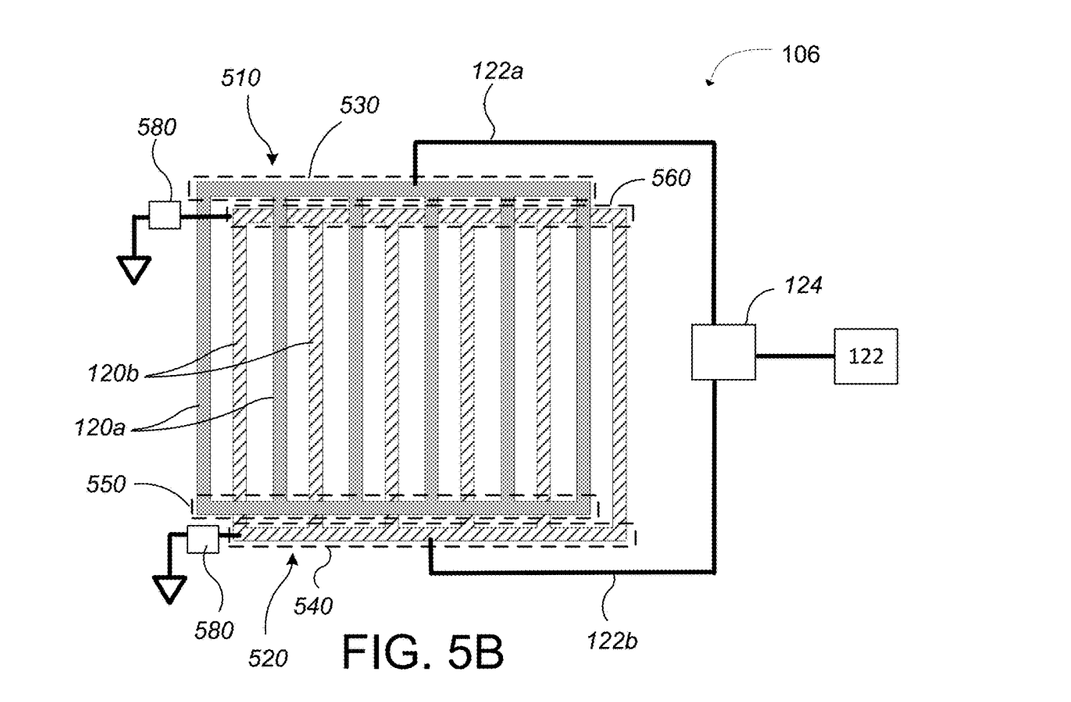

FIGS. 5A and 5B are schematic diagrams of various examples of intra-chamber electrode assembly configurations. Referring to FIGS. 5A and 5B, in some implementations the electrode assembly 106 can include a first group of conductors 120a and a second group of conductors 120b. At least within the plasma chamber 104, the conductors 120a, 120b of the first group and the second group can be arranged in an alternating pattern. The first group can be driven by a first terminal 122a of the RF power supply 122, and the second group can be driven by a second terminal 122b of the RF power supply 122. The RF power supply 122 can be configured to provide a first RF signal at the terminal 122a and a second RF signal at terminal 122b. The first and second RF signals can have a same frequency and a stable phase relationship to each other. For example, the phase difference between the first and second RF signals can be 180 degrees. By driving the conductors 120a, 120b with RF signals that have 180 degrees of phase difference, the resulting plasma distribution can be less sensitive to imperfect RF grounding of the electrode 116. Without being limited to any particular theory, this can be because the RF current is returned through the adjacent electrodes due to the differential nature of the driving signals. In some implementations, the phase relationship between the first and the second RF signals provided by the RF power supply 122 can be tunable between 0 and 360.

To generate the signals, an unbalanced output signal from an oscillator of the RF power supply can be coupled to a balun (a balance-unbalance transformer) 124 that outputs balanced signals on the terminals 122a, 122b. Alternatively, the RF supply 122 can include two individual RF power supplies that are phase-locked to each other.

Referring to FIG. 5A, the electrode assembly 120 includes a first electrode subassembly 510 that includes the first group of conductors 120a, and a second electrode subassembly 520 that includes the second group of conductors 120b. The conductors 120a of the first electrode subassembly 510 are interdigited with the conductors 120b of the second electrode subassembly 520.

The subassemblies 510, 520 each has multiple parallel conductors 120a, 120b that extend across the chamber 104. Every other electrode 120, e.g., the electrodes 120a, is connected to a first bus 530 on one side of the chamber 104. The remaining (alternating) electrodes 120, i.e., the electrodes 120b, are each connected to a second bus 540 on the other side of the chamber 104. The end of each conductor 120 that is not connected to an RF power supply bus can be left unconnected, e.g., floating.

The first bus 530 can be connected to the first terminal 122a, and the second bus can be connected to the second terminal 122b. The first electrode subassembly 510 and the second electrode subassembly 520 are oriented parallel to each other such that the conductors of the subassemblies 510 and 520 are parallel to each other.

In some implementations, the buses 530, 540 connecting the conductors 120a, 120b are located outside of the interior space 104. This is preferable for improved uniformity within the chamber 104. However, in some implementations, the buses 530, 540 connecting the conductors 120a, 120b are located in the interior space 104.

FIG. 5B illustrates an electrode assembly 106 that is similar to the implementation shown in FIG. 5A, but the end of each conductor 120 that is not connected to an RF power supply bus can be grounded, e.g., connected to a bus that is grounded. For example, the electrodes 120a can be connected to a third bus 550 on the side of the chamber 104 as the second bus 540, and the electrodes 120b can be connected to a fourth bus 560 on the same side of the chamber 104 as the first bus 530. Each bus 550, 560 can be grounded thought an adjustable impedance 580, e.g., an impedance matching network.

For either FIG. 5A or FIG. 5B, optionally a low frequency common mode bias can be applied between the electrode subassemblies 510, 520. This can controllably increase the plasma potential.

Figure 5C:
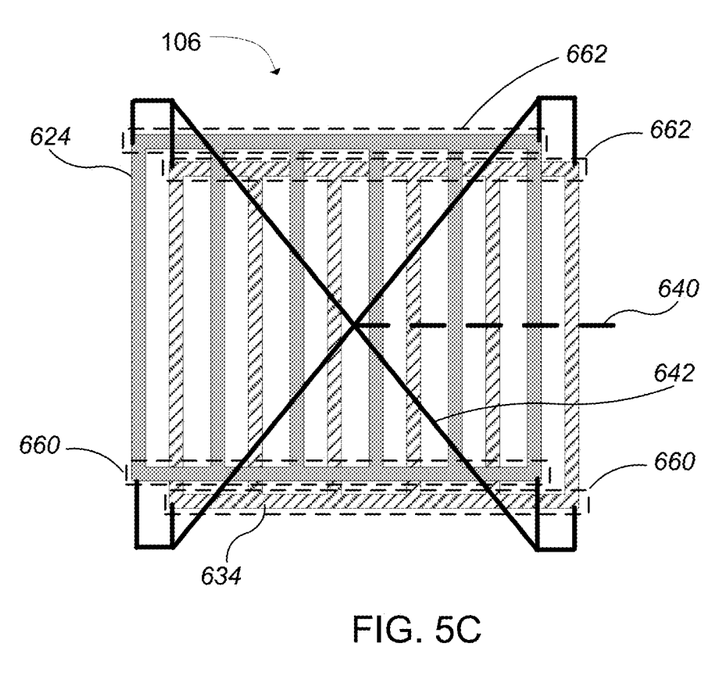

Referring to FIG. 5C, an electrode assembly 106 includes a first electrode subassembly 624 and a second electrode subassembly 634. The first electrode subassembly 624 and the second electrode subassembly 634 each have multiple parallel conductors 120 that are connected by buses 660 and 662 at both ends. The first electrode subassembly 624 and the second electrode subassembly 634 are configured such that the conductors of the subassemblies 624 and 634 are parallel to each other, with the conductors of the subassemblies 624, 635 arranged in an alternating pattern.

The electrode assembly 106 can be driven with RF signals in various ways. In some implementations, the subassembly 624 and subassembly 634 are driven with a same RF signal with respect to an RF ground. In some implementations, the subassembly 624 and subassembly 634 are driven with a differential RF signal. In some implementations, the subassembly 624 is driven with an RF signal, and the subassembly 634 is connected to an RF ground.

In some implementations, the intra-chamber electrode assembly 604 is driven in a single-ended manner with an RF signal using a center-feed 640. The center-feed 640 is connected to an X-shaped current splitter 642 at the center. The four corners of the subassemblies 624 and 634 are connected to the X-shaped current splitter 642 using vertical feed structures.

In general, differential driving of the subassemblies 620, 622, 624 and the respective subassemblies 630, 632, 634 can improve plasma uniformity or process repeatability when an adequate RF ground cannot be provided (e.g., RF ground through a rotary mercury coupler, brushes, or slip rings).

Plasma simulation, using a 2-D model, was performed to investigate plasma parameter dependence on gas pressure. The computational domain was over two half-pairs of electrodes. Process conditions were assumed to be 1450 sccm Argon+50 sccm $N_2$ per source, 6 torr, 200 W per pair of half electrodes. Simulation indicated plasma densities generally would be higher in the region below the electrodes. Ar+ density and electron density were similar (much lower N2+ density, primarily due to high ratio of Argon to N2 gas supply.

Particular embodiments of the invention have been described. While this specification contains many specific implementation details, many other variations are possible. For example:

Rather than a rotating platform, the workpiece may be moved linearly through a sequence of chambers, e.g., on a belt or linearly actuated platform. In addition, the workpiece could be stationary, e.g., the workpiece support does not move relative to the filaments.

Connection of the RF power to the conductor busses at the center, ends, or other position or combination of positions on the bus.

Grounding of electrode busses can be performed at the center, ends, or other position or combination of positions on the bus.

The RF power supply can apply signals in the RF, VHF, UHF or microwave range.

Other embodiments are within the scope of the following claims.

What is claimed is:

1. A plasma reactor comprising:
 a chamber body having an interior space that provides a plasma chamber;
 a gas distributor to deliver a processing gas to the plasma chamber;
 a workpiece support to hold a workpiece;
 an electrode assembly comprising a plurality of conductors extending laterally in parallel across at least a region spanning an expected position of the workpiece on the workpiece support in a coplanar array;
 a RF power source to supply a first RF power to the electrode assembly;
 a dielectric bottom plate between the electrode assembly and the workpiece support, the dielectric bottom plate providing an RF window between the electrode assembly and the plasma chamber;
 a dielectric top plate having a lower surface with a plurality of parallel grooves; and
 a plurality of filaments in the plurality of grooves between the dielectric top plate and the RF window, each filament comprising a single conductor from the plurality of conductors and a non-metallic shell surrounding the single conductor and positioned between the dielectric top plate and the RF window, wherein the shell forms a conduit and the single conductor extends through the conduit as a solid wire and is suspended in the conduit with a gap surrounding and separating the single conductor from the shell such that the single conductor is spaced apart from an inner floor of the shell.

2. The plasma reactor of claim 1, wherein the dielectric top plate is a ceramic body and the dielectric bottom plate is quartz or silicon nitride.

3. The plasma reactor of claim 1, wherein the plurality of conductors are uniformly spaced apart.

4. The plasma reactor of claim 1, wherein a spacing between the workpiece support and the plurality of conductors is 2 mm to 50 cm.

5. The plasma reactor of claim 1, wherein the plurality of conductors includes a first multiplicity of conductors and a second multiplicity of conductors arranged in an alternating pattern with the first multiplicity of conductors, and the RF power source is configured to apply a first RF input signal to the first multiplicity of conductors, and to apply a second RF input signal to the second multiplicity of conductors.

6. The plasma reactor of claim 5, wherein the RF power source is configured to generate the first RF input signal and the second RF input signal with same frequency.

7. The plasma reactor of claim 6, wherein the RF power source is configured to generate the first RF input signal and the second RF input signal such that a phase difference between the first RF input signal and the second RF input signal is 180°.

8. The plasma reactor of claim 6, wherein the RF power source is configured to provide an adjustable phase difference between the first RF input signal and the second RF input signal.

9. The plasma reactor of claim 5, wherein the plurality of conductors have a plurality of first ends at a first side of the plasma chamber and a plurality of second ends at an opposite second side of the plasma chamber.

10. The plasma reactor of claim 9, wherein the RF power source is configured to apply the first RF input signal to the first ends of the first multiplicity of conductors and to apply the second RF input signal to the second ends of the second multiplicity of conductors.

11. The plasma reactor of claim 10, wherein second ends of the first multiplicity of conductors are floating and first ends of the second multiplicity of conductors are floating.

12. The plasma reactor of claim 10, wherein the first ends of the first multiplicity of conductors are connected to a first common bus, and the second ends of the second multiplicity of conductors are connected to a second common bus.

13. The plasma reactor of claim 10, wherein the second ends of the first multiplicity of conductors are grounded and the first ends of the second multiplicity of conductors are grounded.

14. The plasma reactor of claim 13, wherein the first ends of the first multiplicity of conductors are connected to a first common bus located outside the plasma chamber on the first side of the chamber, the second ends of the second multiplicity of conductors are connected to a second common bus located outside the plasma chamber on the second side of the chamber, the second ends of the first multiplicity of conductors are connected to a third common bus located outside the plasma chamber on the second side of the chamber, and the first ends of the second multiplicity of conductors are connected to a fourth common bus located outside the plasma chamber on the first side of the chamber.

15. The plasma reactor of claim 1, wherein the shell is cylindrical and plurality of grooves have straight side-walls.

16. The plasma reactor of claim 1, wherein a bottom of the shell is flush with the lower surface.

17. The plasma reactor of claim 1, wherein the shell is an oxide.

18. The plasma reactor of claim 2, wherein the shell is silicon, silicon oxide, silicon carbide, or aluminum oxide.

* * * * *